United States Patent
Li et al.

(10) Patent No.: US 12,142,475 B2
(45) Date of Patent: Nov. 12, 2024

(54) SEQUENTIAL PLASMA AND THERMAL TREATMENT

(71) Applicant: Applied Materials, Inc., Santa Clara, CA (US)

(72) Inventors: Ning Li, San Jose, CA (US); Shuaidi Zhang, San Jose, CA (US); Mihaela A. Balseanu, Sunnyvale, CA (US); Qi Gao, Wilmington, MA (US); Rajesh Prasad, Lexington, MA (US); Tomohiko Kitajima, San Jose, CA (US); Chang Seok Kang, Santa Clara, CA (US); Deven Matthew Raj Mittal, Middleton, MA (US); Kyu-Ha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 520 days.

(21) Appl. No.: 17/667,704

(22) Filed: Feb. 9, 2022

(65) Prior Publication Data
US 2022/0262619 A1    Aug. 18, 2022

Related U.S. Application Data

(60) Provisional application No. 63/150,157, filed on Feb. 17, 2021.

(51) Int. Cl.
*H01L 21/02* (2006.01)
*C23C 16/34* (2006.01)
(Continued)

(52) U.S. Cl.
CPC ........ *H01L 21/0217* (2013.01); *C23C 16/345* (2013.01); *C23C 16/56* (2013.01);
(Continued)

(58) Field of Classification Search
CPC ........... H01L 21/0217; H01L 21/02123; H01L 21/0234; H01L 21/02345; C23C 16/56;
(Continued)

(56) References Cited

U.S. PATENT DOCUMENTS

| | | |
|---|---|---|
| 9,960,045 B1 | 5/2018 | Purayath |
| 10,319,739 B2 | 6/2019 | Purayath |

(Continued)

FOREIGN PATENT DOCUMENTS

| | | |
|---|---|---|
| KR | 101774506 B1 | 9/2017 |
| KR | 20200141257 A | 12/2020 |
| WO | 2018/195423 A1 | 10/2018 |

OTHER PUBLICATIONS

PCT International Search Report and Written Opinion in PCT/US2022/016083 dated May 25, 2022, 8 pages.

(Continued)

*Primary Examiner* — Joseph C. Nicely
(74) *Attorney, Agent, or Firm* — Servilla Whitney LLC

(57) ABSTRACT

Methods of manufacturing memory devices are provided. The methods improve the quality of a selectively deposited silicon-containing dielectric layer. The method comprises selectively depositing a silicon-containing dielectric layer in a recessed region of a film stack. The selectively deposited silicon-containing dielectric layer is then exposed to a high-density plasma and annealed at a temperature greater than 800 ° C. to provide a silicon-containing dielectric film having a wet etch rate of less than 4 Å/min.

19 Claims, 5 Drawing Sheets

(51) Int. Cl.
   *C23C 16/56* (2006.01)
   *H10B 41/27* (2023.01)
   *H10B 41/35* (2023.01)
   *H10B 43/35* (2023.01)
   *H10B 43/27* (2023.01)

(52) U.S. Cl.
   CPC .... *H01L 21/02123* (2013.01); *H01L 21/0234* (2013.01); *H01L 21/02345* (2013.01); *H10B 41/27* (2023.02); *H10B 41/35* (2023.02); *H10B 43/35* (2023.02); *H01L 21/0228* (2013.01); *H10B 43/27* (2023.02)

(58) Field of Classification Search
   CPC ...... C23C 16/345; H10B 41/27; H10B 41/35; H10B 43/27; H10B 43/35
   See application file for complete search history.

(56) References Cited

U.S. PATENT DOCUMENTS

| | | | |
|---|---|---|---|
| 10,325,923 | B2 | 6/2019 | Purayath |
| 10,354,916 | B2 | 6/2019 | Chen et al. |
| 10,410,869 | B2 | 9/2019 | Roy et al. |
| 10,468,259 | B2 | 11/2019 | Purayath et al. |
| 10,529,737 | B2 | 1/2020 | Purayath |
| 10,541,246 | B2 | 1/2020 | Purayath |
| 10,553,604 | B2 | 2/2020 | Lu et al. |
| 10,622,251 | B2 | 4/2020 | Chen et al. |
| 10,790,298 | B2 * | 9/2020 | Purayath ........... H01L 21/67069 |
| 10,886,172 | B2 | 1/2021 | Chen |
| 10,964,717 | B2 | 3/2021 | Kang et al. |
| 10,998,329 | B2 | 5/2021 | Koshizawa et al. |
| 11,024,371 | B2 | 6/2021 | Cui et al. |
| 11,049,695 | B2 | 6/2021 | Kang et al. |
| 11,930,637 | B2 * | 3/2024 | Kang ................ H01L 21/68707 |
| 2007/0042548 | A1 | 2/2007 | Noh et al. |
| 2014/0175530 | A1 | 6/2014 | Chien et al. |
| 2015/0123189 | A1 | 5/2015 | Sun et al. |
| 2017/0069637 | A1 | 3/2017 | Son et al. |
| 2017/0278864 | A1 | 9/2017 | Hu et al. |
| 2018/0090307 | A1 | 3/2018 | Brunner et al. |
| 2018/0144977 | A1 | 5/2018 | Yu et al. |
| 2018/0330985 | A1 | 11/2018 | Yu et al. |
| 2018/0374863 | A1 | 12/2018 | Purayath |
| 2019/0393042 | A1 | 12/2019 | Roy et al. |
| 2020/0051994 | A1 | 2/2020 | Purayath et al. |
| 2020/0118822 | A1 | 4/2020 | Falk et al. |
| 2020/0185408 | A1 | 6/2020 | Song et al. |
| 2020/0203373 | A1 | 6/2020 | Kang et al. |
| 2020/0266202 | A1 | 8/2020 | Kwon |
| 2020/0266211 | A1 | 8/2020 | Tao et al. |
| 2020/0286903 | A1 | 9/2020 | Cui et al. |
| 2020/0312874 | A1 | 10/2020 | Kang et al. |
| 2020/0350014 | A1 | 11/2020 | Liu |
| 2020/0350287 | A1 | 11/2020 | Liu |
| 2020/0402562 | A1 | 12/2020 | Li et al. |
| 2020/0411509 | A1 | 12/2020 | Yang et al. |
| 2021/0257375 | A1 | 1/2021 | Koshizawa et al. |
| 2021/0043643 | A1 | 2/2021 | Lu et al. |
| 2021/0126005 | A1 | 4/2021 | Lu et al. |
| 2021/0210142 | A1 | 7/2021 | Liu |
| 2021/0217773 | A1 | 7/2021 | Kang et al. |
| 2021/0225865 | A1 | 7/2021 | Wu |
| 2021/0233779 | A1 | 7/2021 | Kang et al. |
| 2021/0233918 | A1 | 7/2021 | Koshizawa et al. |
| 2021/0249436 | A1 | 8/2021 | Ding et al. |
| 2021/0257385 | A1 | 8/2021 | Hu et al. |
| 2021/0257386 | A1 | 8/2021 | Wang et al. |
| 2021/0257387 | A1 * | 8/2021 | Huang ................... H10B 43/27 |
| 2023/0369031 | A1 * | 11/2023 | Kitajima ........... H01L 21/67184 |

OTHER PUBLICATIONS

Qin, Shu, "Plasma Doping (PLAD) for Advanced Memory Device Manufacturing", Micron Technology Inc.

Srivastava, Aseem, et al., "Next Generation Plasma Doping: First Results of a Heated E-chuck", 2018 22nd International Conference on Ion Implantation Technology (IIT), 2018, pp. 38-41, doi: 10.1109/IIT.2018.8807944.

* cited by examiner

SEQUENTIAL PLASMA AND THERMAL TREATMENT

CROSS-REFERENCE TO RELATED APPLICATIONS

This application claims priority to U.S. Provisional Application No. 63/150,157, filed Feb. 17, 2021, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide methods for forming 3D-NAND devices with high quality silicon-containing dielectric layers.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Current processes employed in 3D-NAND manufacturing use high temperature atomic layer deposition (ALD) or chemical vapor deposition (CVD) silicon nitride (SiN) with subsequent additional patterning steps. Selective deposition of SiN can eliminate the patterning steps. Selective deposition, however, requires relatively low deposition temperatures, which yield poor quality films.

Accordingly, there is a need in the art for 3D-NAND devices having high quality SiN films. Additionally, there is a need in the art for methods and apparatus for forming the 3D-NAND devices.

SUMMARY

One or more embodiments of the disclosure are directed to a processing method. In one embodiment, a processing method comprises: selectively depositing a silicon-containing dielectric layer in a recessed region of a film stack, the film stack comprising alternating layers of a first material layer and a second material layer and having a memory hole extending through the film stack; exposing the silicon-containing dielectric layer to a high density plasma at a temperature less than or equal to 500° C. and at a pressure less than 1 Torr; and annealing the silicon-containing dielectric layer at a temperature greater than 800° C. to provide a silicon-containing dielectric film having a wet etch rate of less than 4 Å/min.

Further embodiments of the disclosure are directed to processing tools. In one embodiment, a non-transitory computer readable medium includes instructions, that, when executed by a controller of a processing chamber, causes the processing chamber to perform the operations of: selectively deposit a silicon-containing dielectric layer in a recessed region of a film stack, the film stack comprising alternating layers of a first material layer and a second material layer and having a memory hole extending through the film stack; expose the silicon-containing dielectric layer to a high density plasma at a temperature less than or equal to 500° C. and at a pressure less than 1 Torr; and anneal the silicon-containing dielectric layer at a temperature greater than 800° C. to provide a silicon-containing dielectric film having a wet etch rate of less than 4 Å/min.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

One or more embodiments provide a processing method including plasma-based doping (PLAD) and annealing in an integrated processing tool to permit low temperature selective deposition of silicon-containing dielectric films, e.g., silicon nitride, on a recessed polysilicon sidewall through the high aspect ratio memory hole in a 3D NAND cell film stack.

Selective deposition of silicon-containing dielectric films, e.g., silicon nitride, is a low temperature process that results in poor quality films. Without intending to be bound by theory, it is thought that if the poor quality selectively deposited silicon-containing dielectric films cannot be converted to high quality silicon-containing films, selectively deposited silicon-containing films, particularly silicon nitride, cannot be used to form 3D NAND cell structures.

Figure 1:
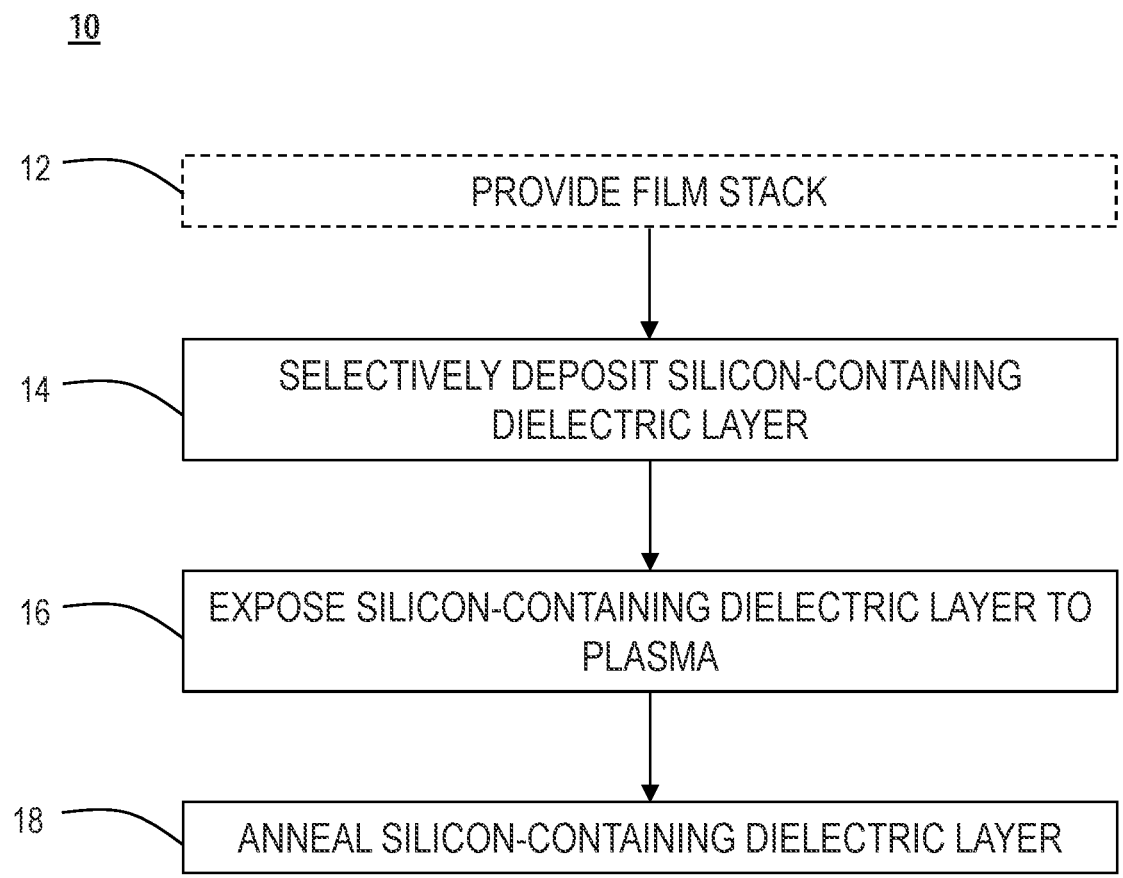
FIG. 1 depicts a flow process diagram of one embodiment of a method according to embodiments described herein.

FIG. 1 illustrates a flowchart for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 12, a film stack is provided. As used herein, the term "provided" means that the substrate is made available for processing (e.g., positioned in a processing chamber). At operation 14, a silicon-containing dielectric layer is selectively deposited in a recessed region of a film stack. At operation 16, the silicon-containing dielectric layer is exposed to a high-density plasma, and, at operation 18, the silicon-containing dielectric layer is annealed at a temperature greater than 800° C. to provide a silicon-containing dielectric film having a wet etch rate of less than 4 Å/min.

Figure 2A:
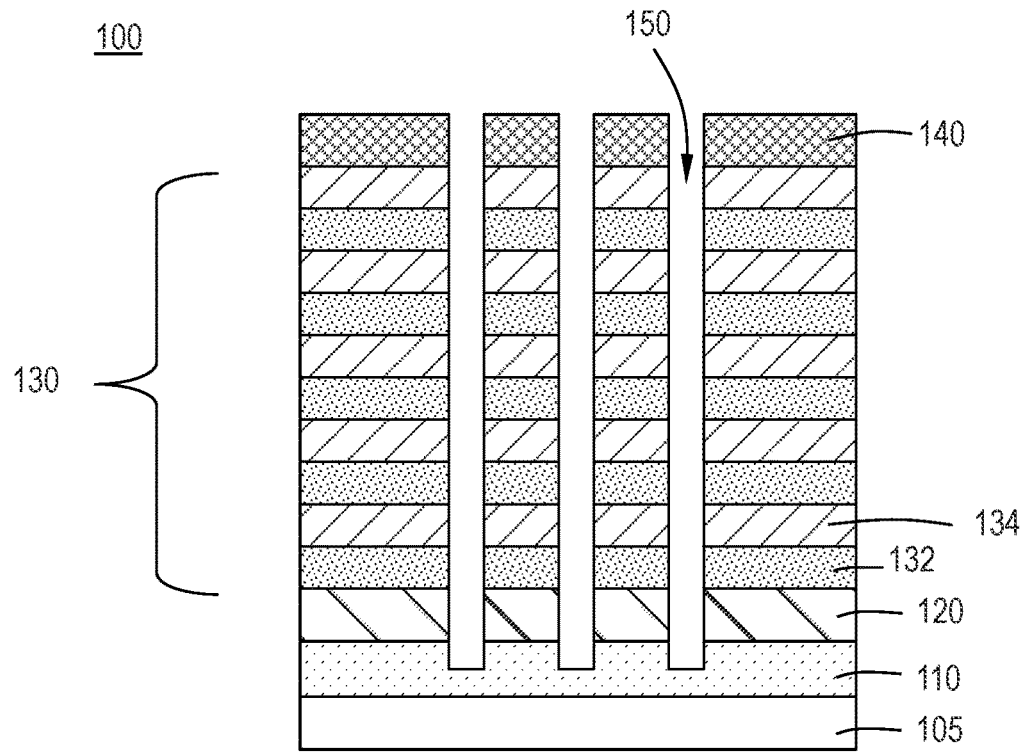
FIG. 2A illustrates a cross-sectional view of a device according to one or more embodiments.

FIGS. 2-5 illustrate a portion of a memory device 100 following the process flow illustrated for the method 10 in FIG. 1. FIG. 2 illustrates an electronic device 100 in accordance with one or more embodiments of the disclosure. In some embodiments, the electronic device 100 shown in FIG. 2 is formed on the bare substrate 105 in layers, as illustrated. The electronic device of FIG. 2 is made up of a substrate 105, a semiconductor layer 110, an optional sacrificial layer 120, a memory stack 130, and an optional oxide layer 140.

The substrate 105 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, a semiconductor layer 110 is on the substrate 105. In some embodiments, the semiconductor layer 110 may also be referred to as the common source line. The semiconductor layer 110 can be formed by any suitable technique known to the skilled artisan and can be made from any suitable material including, but not limited to, polysilicon (poly-Si). In some embodiments, the semiconductor layer 110 is a common source line that is made of a conductive or a semiconductor material.

In one or more embodiments, the optional sacrificial layer 120 is formed on the semiconductor layer 110 and can be made of any suitable material. The sacrificial layer 120 in some embodiments is removed and replaced in later processes. In some embodiments, the sacrificial layer 120 is not removed and remains within the memory device 100. In this case, the term "sacrificial" has an expanded meaning to include permanent layers and may be referred to as the conductive layer. In one or more embodiments, the optional sacrificial layer 120 comprises a material that can be removed selectively versus the neighboring semiconductor layer 110 and second material layer 132.

In one or more embodiments, a memory stack 130 is formed on the optional sacrificial layer 120. The memory stack 130 in the illustrated embodiment comprises a plurality of alternating second material layers 132 and first material layers 134. In one or more embodiments, the first material layers 134 comprise nitride layers and the second material layers 132 comprise oxide layers. In some embodiments, the memory stack 130 comprises a non-replacement gate such as alternating oxide and polysilicon, or oxide and metal, or oxide and sacrificial layer. The first material layers 134 comprise a material that is etch selective relative to the second material layers 132 so that the first material layers 134 can be removed without substantially affecting the second material layers 132. In one or more embodiments, the first material layers 134 comprises one or more of polysilicon, silicon nitride (SiN), silicon carbide (SiC), silicon oxycarbide (SiOC), germanium (Ge), and titanium nitride (TiN). In one or more embodiments, the first material layers 134 comprise silicon nitride. In one or more embodiments, the second material layers 132 comprise silicon oxide.

The individual alternating layers may be formed to any suitable thickness. In some embodiments, the thickness of each second layer 132 is approximately equal. In one or more embodiments, each second layer 132 has a first second layer thickness. In some embodiments, the thickness of each first layer 134 is approximately equal. As used in this regard, thicknesses which are approximately equal are within +/−5% of each other. In some embodiments, a silicon layer (not shown) is formed between the second material layers 132 and first material layers 134. The thickness of the silicon layer may be relatively thin as compared to the thickness of a layer of second material layers 132 or first material layers 134.

Figure 2B:
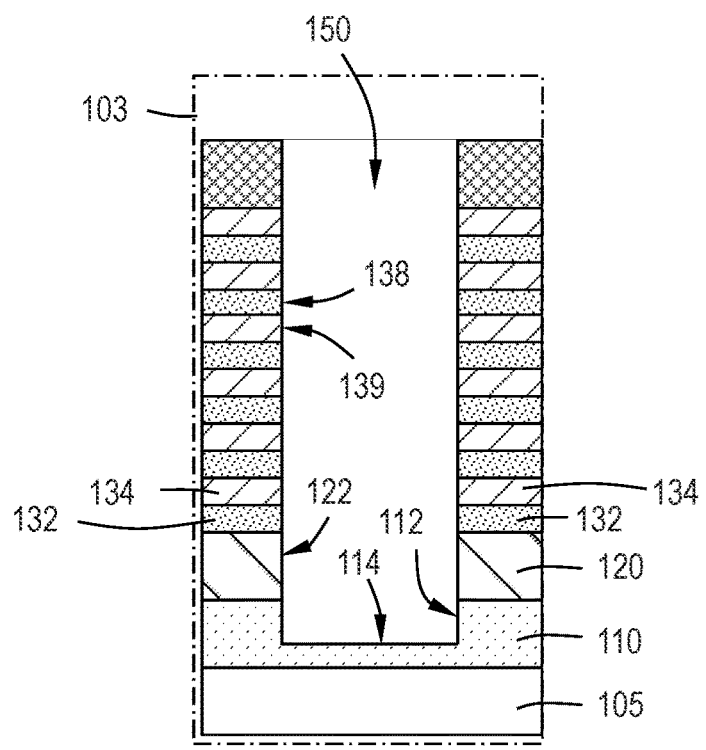
FIG. 2B illustrates a cross-sectional view region 103 of the substrate of FIG. 2A according to one of more embodiments.

In one or more embodiments, a memory hole channel 150 is opened through the memory stack 130. In some embodiments, opening the memory hole channel 150 comprises etching through the oxide layer 140, memory stack 130, sacrificial layer 120, and into semiconductor layer 110. Referring to FIG. 2B, which is an expanded view of region 103, the memory hole channel 150 has sidewalls that extend through the memory stack 130 exposing surfaces 138 of the second material layers 132 and surface 139 of the first material layers 134.

In one or more embodiments, the memory hole channel 150 has a high aspect ratio. As used herein, the term "high aspect ratio" refers to a feature having a height: width ratio greater than or equal to about 10, 20, or 50, or more.

In one or more embodiments, the optional sacrificial layer 120 has surfaces 122 exposed as sidewalls of the memory hole channel 150. The memory hole channel 150 extends a distance into the semiconductor layer 110 so that sidewall surface 112 and bottom 114 of the memory hole channel 150 are formed within the semiconductor layer 110. The bottom 114 of the memory hole channel 150 can be formed at any point within the thickness of the semiconductor layer 110. In some embodiments, the memory hole channel 150 extends a thickness into the semiconductor layer 110 in the range of from about 10% to about 90%, or in the range of from about 20% to about 80%, or in the range of from about 30% to about 70%, or in the range of from about 40% to about 60% of the thickness of the semiconductor layer 110. In some embodiments, the memory hole channel 150 extends a distance into the semiconductor layer 110 by greater than or equal to 10%, 20%, 30%, 40%, 50%, 60%, 70% or 80% of the thickness of the semiconductor layer 110.

Figure 3:
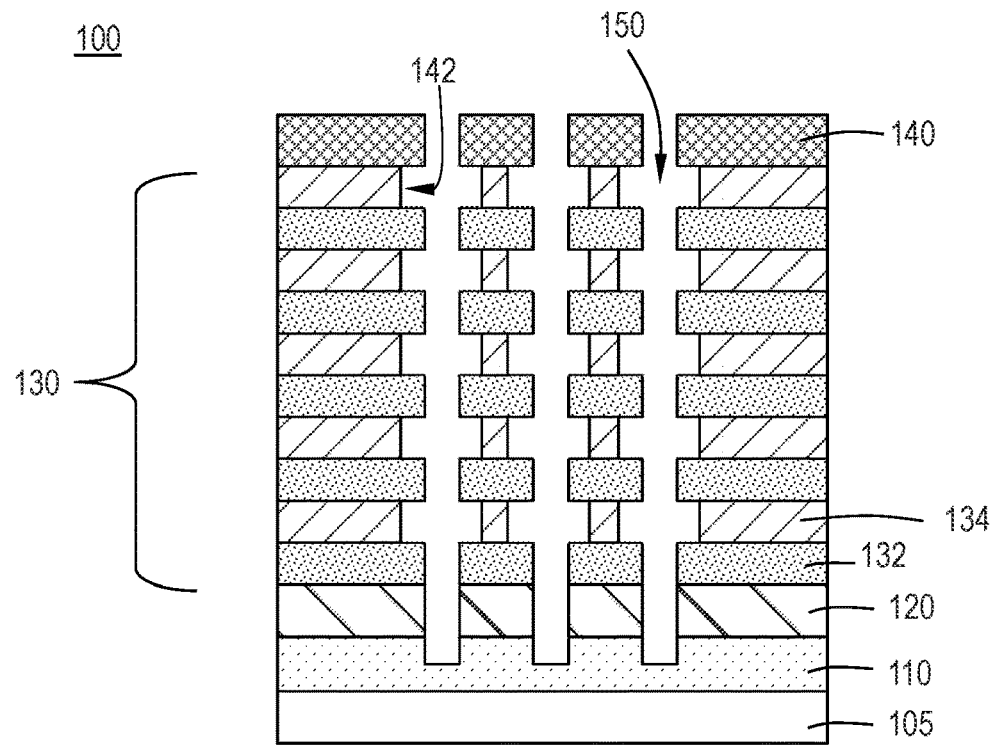
FIG. 3 illustrates a cross-sectional view of a device according to one or more embodiments.

FIG. 3 illustrates recessing the first material layers 134 relative to the second material layer 132 through the memory hole channel 150. In one or more embodiments, a recessed region 142 is formed. The first material layers 134 may be recessed according to any suitable process known to the skilled artisan. In other embodiments, the memory hole channel 150 can be formed structurally, for example: polysilicon channel material can be deposited in the memory hole of SiN/SiO/SiN stack, after which SiN is removed and SiO is trimmed, leaving a SiO structure that has a recess which opens to poly-Si channel. In this case, 134 is not only recessed but completely removed, and the filled channel material is exposed.

Figure 4:
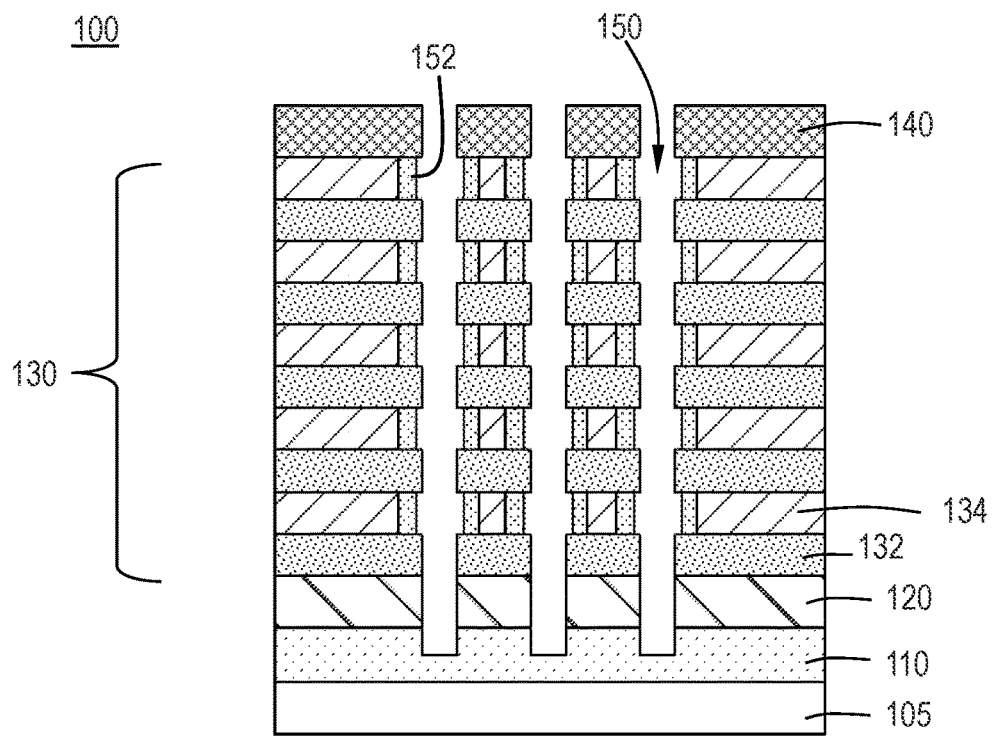
FIG. 4 illustrates a cross-sectional view of a device according to one or more embodiments.

FIG. 4 shows operation 14 in which a silicon-containing dielectric layer 152 is selectively deposited in the recessed region 142. In one or more embodiments, the silicon-containing dielectric layer 152 can be deposited by any suitable means known to the skilled artisan. In one or more embodiments, the silicon-containing dielectric layer 152 is deposition, e.g., atomic layer deposition (ALD) or chemical vapor deposition (CVD), at a temperature less than 500° C. In other embodiments, the silicon-containing dielectric layer 152 is deposited at a temperature less than 500° C., including less than 490° C., less than 450° C., less than 400° C., less than 350° C., and less than 300° C.

The silicon-containing dielectric layer 152 may comprise any suitable material dielectric material known to the skilled artisan. As used herein, the term "dielectric material" refers to a layer of material that is an electrical insulator that can be polarized in an electric field. In one or more embodiments, the silicon-containing dielectric layer 152 comprises one or more of silicon nitride (SiN), silicon carbonitride (SiCN), silicon oxynitride (SiON), silicon oxycarbonitride (SiOCN), silicon boride (SiB), and silicon boron nitride (SiBN). In specific embodiments, the silicon-containing dielectric layer 152 comprises silicon nitride (SiN).

In one or more embodiments, deposition of the silicon-containing dielectric layer 152 is selective to the first material layer 134 over the second material layer 132, such that the silicon-containing dielectric layer 152 deposits in the recessed region 142.

In one or more embodiments, the silicon-containing dielectric layer 152 has a thickness in a range of from greater than 0 Å to 25 Å.

Without intending to be bound by theory, it is thought that the relatively low deposition temperature (i.e., less than 490° C.) leads to a poor-quality silicon-containing dielectric layer 152. Accordingly, the poor-quality silicon-containing dielectric layer 152 has a poor wet etch rate (WER) of greater than 300 Å.

Figure 5:
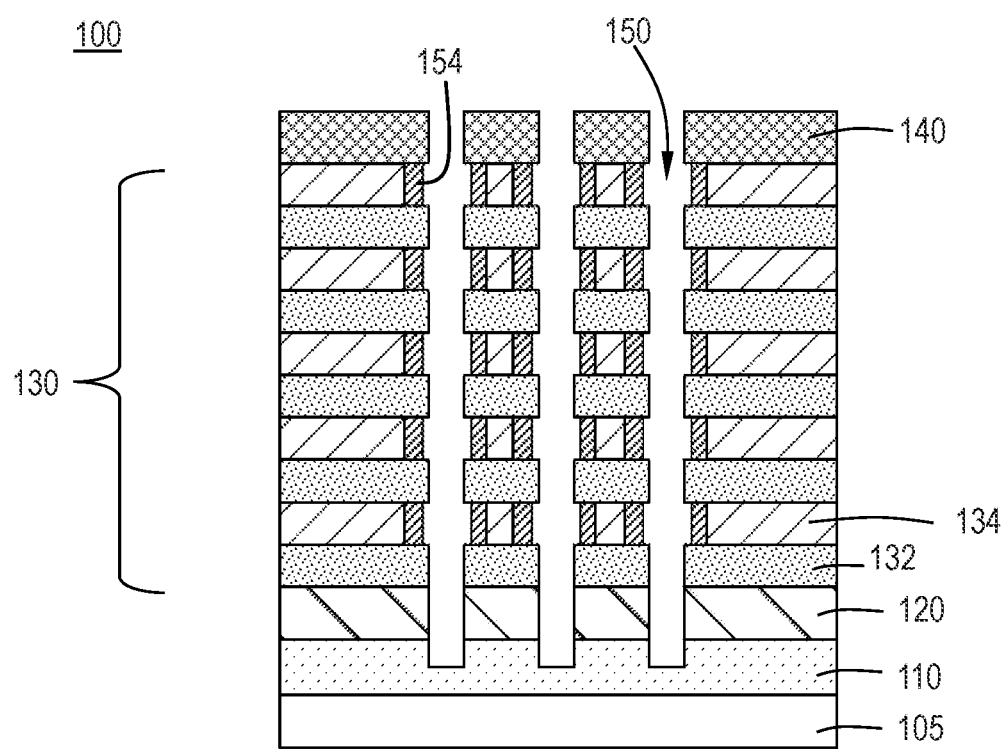
FIG. 5 illustrates a cross-sectional view of a device according to one or more embodiments.

FIG. 5 shows operation 16 and operation 18 in which silicon-containing dielectric layer 152 is exposed to a high-density plasma and is then annealed to provide a high-quality silicon-containing dielectric film 154. In some embodiments, the silicon-containing dielectric layer 152 may be exposed to the plasma at a temperature less than or equal to 500° C., including 500° C., 475° C., 450° C., 425° C., 400° C., 350° C., 300° C., 250° C., 200° C., 150° C., 100° C., and 50° C. In some embodiments, the silicon-containing dielectric layer 152 may be exposed to the plasma at a temperature in a range of from 400° C. to 500° C., including a range of from 400 to 450° C., or a range of from 420 to 490° C., or a range of from 420 to 475° C., or a range of from 420 to 490° C. In one or more embodiments, the silicon-containing dielectric layer 152 may be exposed to the plasma at a temperature including 400° C., 405° C., 410° C., 415° C., 420° C., 425° C., 430° C., 435° C., 440° C., 445° C., 450° C., 455° C., 460° C., 465° C., 470° C., 475° C., 480° C., 485° C., 490° C., 495° C., and 500° C.

In one or more embodiments, plasma doping (PLAD) is used because the aspect ratio of memory hole channel 150 is very high and a conformal implant process is optionally used to inject impurities in the sidewall of the silicon-containing dielectric layer 152, from top layer to bottom layer, through a very high AR memory hole. This can only be done by PLAD. Without intending to be bound by theory, it is thought that the plasma treatment effect results from inert ion bombardment of the silicon-containing dielectric layer 152.

In one or more embodiments, the plasma comprises a noble gas. In some embodiments, the plasma is selected from one or more of helium (He), hydrogen (H$_2$), neon (Ne), argon (Ar), krypton (Kr), and xenon (Xe).

In some embodiments, the silicon-containing dielectric layer 152 may be exposed to the plasma at a pressure less than 1 Torr, including a pressure in a range of from greater than 0 mTorr to less than 1 Torr, a range of from greater than 0 mTorr to 100 mTorr, range of from greater than 0 mTorr to 500 mTorr.

In one or more embodiments, the plasma treatment comprises a plasma doping process where the silicon-containing dielectric layer 152 is exposed to a high-density plasma with a high negative voltage DC bias on a wafer. In some embodiments, the high voltage pulse is in a range of from −0.2 kV to −10 kV, for a time period of 20 μs to 150 μs at 0.5 kHz to 10 kHz.

In one or more embodiments, at operation 18, the selectively deposited silicon-containing dielectric layer 152 is annealed using rapid thermal processing (RTP). In one or more embodiments, the silicon-containing dielectric layer 152 is annealed at a temperature greater than 800° C. to provide a silicon-containing dielectric film 154. In some embodiments, the silicon-containing dielectric layer 152 is annealed at a temperature greater than 1000° C. to provide the silicon-containing dielectric film 154. In one or more embodiments, after plasma treatment and annealing, the silicon-containing dielectric film 154 is a highly-quality film and has a wet etch rate of less than 4 Å/min, including a wet etch rate of less than 3 Å/min, less than 2 Å/min, and less than 1 Å/min.

In one or more embodiments, the silicon-containing dielectric film 154 has a thickness in a range of from greater than 0 Å to 25 Å.

The method of one or more embodiments is an integrate method. In one or more embodiments, the method may be performed in one or more processing chamber without breaking vacuum.

Figure 6:
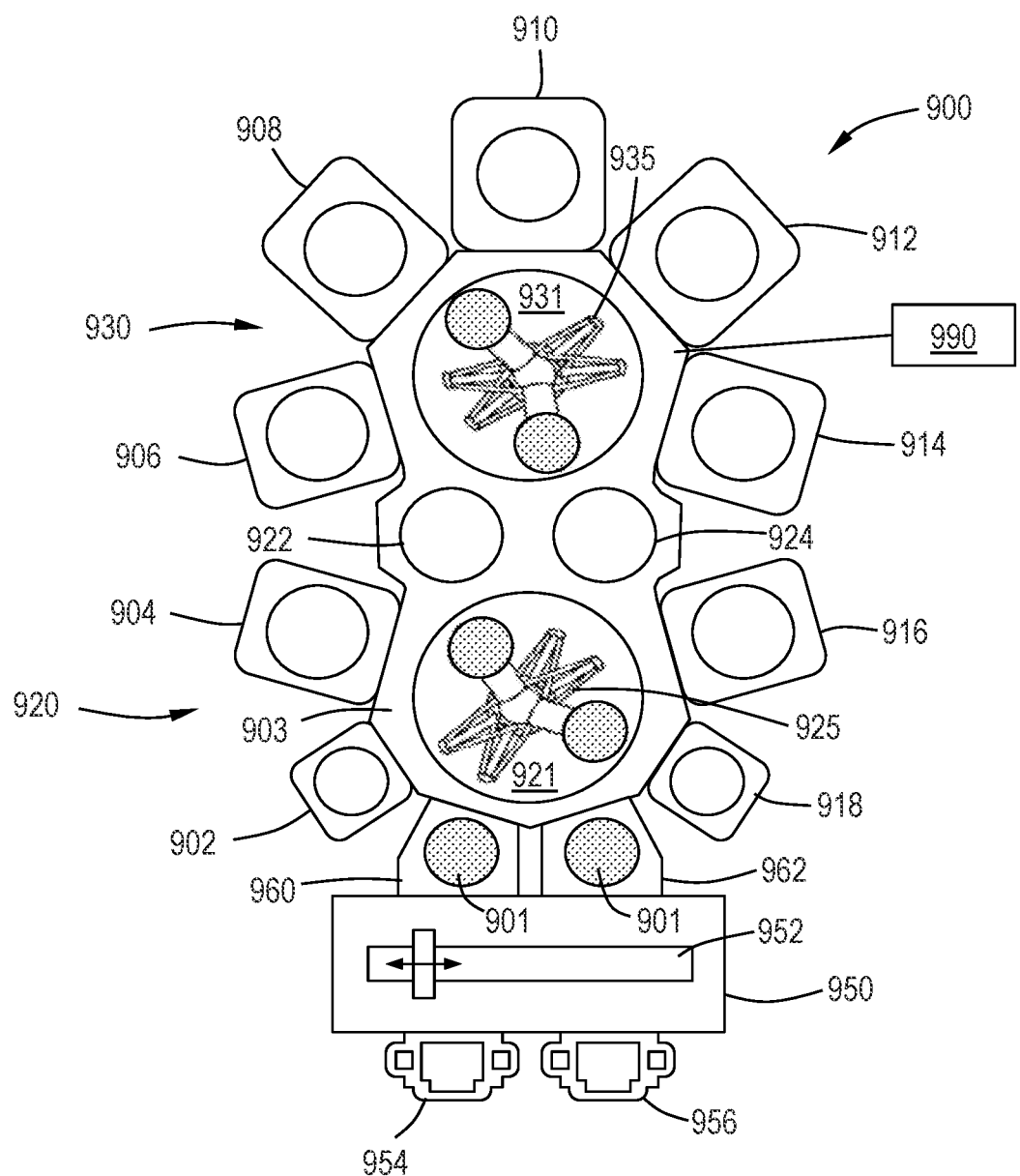
FIG. 6 illustrates a cluster tool according to one or more embodiments.

Additional embodiments of the disclosure are directed to processing tools 900 for the formation of the memory devices and methods described, as shown in FIG. 6.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective oxidation chamber, an oxide layer thinning chamber, or a word line deposition chamber. The particular arrangement of process chambers and components can be varied depending on the cluster tool and should not be taken as limiting the scope of the disclosure.

In some embodiments, the cluster tool 900 includes a selective deposition chamber, a plasma treatment chamber, and an annealing chamber. In some embodiments, the plasma treatment and annealing chamber are the Varian VIISTa® PLAD™ and the Vantage® Vulcan® RTP from Applied Materials in Santa Clara, Calif.

In the embodiment shown in FIG. 6, a factory interface 950 is connected to a front of the cluster tool 900. The factory interface 950 includes a loading chamber 954 and an unloading chamber 956 on a front of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock chamber 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 990 has a configuration to control the selective deposition chamber to selectively deposit a silicon-containing dielectric layer in a recessed region of a film stack, at a temperature less than 490° C. In some embodiments, the controller 990 has a configuration to activate the plasma treatment chamber expose the silicon-containing dielectric layer to a high-density plasma at a temperature in a range of from 400° C. to 500° C. and at a pressure less than 1 Torr. In other embodiments, the controller 990 has a configuration to control the annealing chamber to anneal the silicon-containing dielectric layer at a temperature greater than 800° C. to provide a silicon-containing dielectric film having a wet etch rate of less than 4 Å/min.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising an selective deposition chamber, a plasma treatment chamber, and an annealing chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   selectively depositing a silicon-containing dielectric layer in a recessed region of a film stack, the film stack comprising alternating layers of a first material layer and a second material layer and having a memory hole extending through the film stack;
   exposing the silicon-containing dielectric layer to a high-density plasma at a temperature less than or equal to 500° C. and at a pressure less than 1 Torr; and
   annealing the silicon-containing dielectric layer at a temperature greater than 800° C. to provide a silicon-containing dielectric film having a wet etch rate of less than 4 Å/min.

2. The method of claim 1, wherein the second material layer comprises an oxide layer.

3. The method of claim 1, wherein the recessed region is formed by recessing the first material layer relative to the second material layer through the memory hole.

4. The method of claim 1, wherein the first material layer comprises one or more of polysilicon, silicon nitride, silicon carbide, silicon carbonitride, germanium, and titanium nitride.

5. The method of claim 1, wherein the silicon-containing dielectric layer comprises one or more of silicon nitride (SiN), silicon carbonitride (SiCN), silicon oxynitride, silicon oxycarbonitride, silicon boride (SiB), and silicon boron nitride (SiBN).

6. The method of claim 5, wherein the silicon-containing dielectric layer comprises silicon nitride.

7. The method of claim 1, wherein selectively depositing the silicon-containing dielectric layer comprises deposition at a temperature less than 500° C.

8. The method of claim 1, wherein the silicon-containing dielectric film has a wet etch rate of less than 1 Å/min.

9. The method of claim 1, wherein the high-density plasma is selected from one or more of helium (He), hydrogen ($H_2$), neon (Ne), argon (Ar), krypton (Kr), and xenon (Xe).

10. The method of claim 1, wherein the silicon-containing dielectric film has a thickness in a range of from greater than 0 Å to 25 Å.

11. The method of claim 1, wherein the method is performed in a processing chamber without breaking vacuum.

12. A non-transitory computer readable medium including instructions, that, when executed by a controller of a processing chamber, causes the processing chamber to perform the operations of:
   selectively deposit a silicon-containing dielectric layer in a recessed region of a film stack, the film stack comprising alternating layers of a first material layer and a second material layer and having a memory hole extending through the film stack;
   expose the silicon-containing dielectric layer to a high-density plasma at a temperature less than or equal to 500° C. and at a pressure less than 1 Torr; and
   anneal the silicon-containing dielectric layer at a temperature greater than 800° C. to provide a silicon-containing dielectric film having a wet etch rate of less than 4 Å/min.

13. The non-transitory computer readable medium of claim 12, wherein the first material layer comprises an oxide layer.

14. The non-transitory computer readable medium of claim 12, wherein the recessed region is formed by recessing the second material layer relative to the first material layer through the memory hole.

15. The non-transitory computer readable medium of claim 12, wherein the second material layer comprises one or more of polysilicon, silicon nitride, silicon carbide, silicon carbonitride, germanium, and titanium nitride.

16. The non-transitory computer readable medium of claim 12, wherein the silicon-containing dielectric layer comprises one or more of silicon nitride (SiN), silicon carbonitride (SiCN), silicon oxynitride, silicon oxycarbonitride, silicon boride (SiB), and silicon boron nitride (SiBN).

17. The non-transitory computer readable medium of claim 16, wherein the silicon-containing dielectric layer comprises silicon nitride.

18. The non-transitory computer readable medium of claim 12, wherein selectively depositing the silicon-containing dielectric layer comprises deposition at a temperature less than 500° C.

19. The non-transitory computer readable medium of claim 12, wherein the high-density plasma is selected from one or more of helium (He), hydrogen ($H_2$), neon (Ne), argon (Ar), krypton (Kr), and xenon (Xe).

* * * * *